(12) United States Patent
Kaufmann

(10) Patent No.: US 7,872,347 B2
(45) Date of Patent: Jan. 18, 2011

(54) LARGER THAN DIE SIZE WAFER-LEVEL REDISTRIBUTION PACKAGING PROCESS

(75) Inventor: Matthew V. Kaufmann, Morgan Hill, CA (US)

(73) Assignee: Broadcom Corporation, Irvine, CA (US)

( * ) Notice: Subject to any disclaimer, the term of this patent is extended or adjusted under 35 U.S.C. 154(b) by 364 days.

(21) Appl. No.: 11/836,606

(22) Filed: Aug. 9, 2007

(65) Prior Publication Data

US 2009/0039508 A1 Feb. 12, 2009

(51) Int. Cl.
*H01L 23/12* (2006.01)
*H01L 23/48* (2006.01)

(52) U.S. Cl. .............. 257/700; 257/738; 257/773; 257/783

(58) Field of Classification Search .............. None
See application file for complete search history.

(56) References Cited

U.S. PATENT DOCUMENTS

| | | | |
|---|---|---|---|
| 5,442,234 A * | 8/1995 | Liang | 257/675 |
| 5,818,105 A * | 10/1998 | Kouda | 257/696 |
| 6,154,366 A * | 11/2000 | Ma et al. | 361/704 |
| 6,271,469 B1 * | 8/2001 | Ma et al. | 174/521 |
| 6,617,674 B2 | 9/2003 | Becker et al. | |
| 6,709,898 B1 * | 3/2004 | Ma et al. | 438/122 |
| 6,734,534 B1 * | 5/2004 | Vu et al. | 257/668 |
| 6,750,397 B2 * | 6/2004 | Ou et al. | 174/524 |
| 6,867,122 B2 | 3/2005 | Weng | |
| 6,946,325 B2 * | 9/2005 | Yean et al. | 438/112 |
| 6,965,160 B2 * | 11/2005 | Cobbley et al. | 257/686 |
| 7,002,245 B2 * | 2/2006 | Huang et al. | 257/701 |
| 7,170,152 B2 * | 1/2007 | Huang et al. | 257/678 |
| 7,268,012 B2 * | 9/2007 | Jiang et al. | 438/106 |
| 7,453,148 B2 * | 11/2008 | Yang et al. | 257/734 |
| 2003/0153172 A1 | 8/2003 | Yajima et al. | |
| 2008/0182401 A1 | 7/2008 | Ke et al. | |
| 2008/0265408 A1 | 10/2008 | Kaufmann et al. | |

FOREIGN PATENT DOCUMENTS

| | | |
|---|---|---|
| KR | 101998703571 | 11/1998 |
| WO | 9631905 A1 | 10/1996 |

* cited by examiner

*Primary Examiner*—Scott B Geyer
(74) *Attorney, Agent, or Firm*—Fiala & Weaver P.L.L.C.

(57) ABSTRACT

Methods, systems, and apparatuses for integrated circuit packages, and processes for forming the same, are provided. In one example, an integrated circuit (IC) package includes an integrated circuit die, a layer of insulating material, a redistribution interconnect on the layer of insulating material, and a ball interconnect. The integrated circuit die has a plurality of terminals on a first surface. The insulating material covers the first surface of the die and fills a space adjacent to one or more sides of the die. The redistribution interconnect has a first portion coupled to a terminal of the die through the first layer, and a second portion that extends away from the first portion over the insulating material filling the space adjacent to the die. The ball interconnect is coupled to the second portion of the redistribution interconnect.

11 Claims, 9 Drawing Sheets

LARGER THAN DIE SIZE WAFER-LEVEL REDISTRIBUTION PACKAGING PROCESS

BACKGROUND OF THE INVENTION

1. Field of the Invention

The present invention relates to integrated circuit packaging technology, and more particularly to wafer-level ball grid array packages.

2. Background Art

Integrated circuit (IC) chips or dies are typically interfaced with other circuits using a package that can be attached to a printed circuit board (PCB). One such type of IC die package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB.

An advanced type of BGA package is a wafer-level BGA package. Wafer-level BGA packages have several names in industry, including wafer level chip scale packages (WLCSP), among others. In a wafer-level BGA package, the solder balls are mounted directly to the IC chip when the IC chip has not yet been singulated from its fabrication wafer. Wafer-level BGA packages can therefore be made very small, with high pin out, relative to other IC package types including traditional BGA packages.

A current move to tighter fabrication process technologies, such as 65 nm, with a continuing need to meet strict customer reliability requirements and ongoing cost pressures, is causing difficulties in implementing wafer-level BGA package technology. For example, due to the small size of the die used in wafer-level BGA packages, in some cases there is not enough space to accommodate all of the package pins at the pin pitch required for the end-use application Thus, what is needed are improved wafer-level packaging fabrication techniques that can provide BGA packages at smaller package sizes, while enabling all the necessary package signals to be made available outside of the package at a pin pitch suitable for end-use applications.

BRIEF SUMMARY OF THE INVENTION

Methods, systems, and apparatuses for wafer-level integrated circuit (IC) packages are described. One or more redistribution layers route signals from terminals of a die past an edge of the die over a space filled with an insulating material. Pins (e.g., ball interconnects) are coupled to the redistribution layers over the insulating material to be used to mount a package formed by the die and insulating material to a circuit board. Routing the redistribution layers over the insulating material adjacent to the die effectively increases an area of the die to allow for additional space for signal pins.

In one example, an integrated circuit (IC) package includes an integrated circuit die, a layer of insulating material, a redistribution interconnect on the layer of insulating material, and a ball interconnect. The integrated circuit die has a plurality of terminals on a first surface. The insulating material covers the first surface of the die and fills a space adjacent to one or more sides of the die. The redistribution interconnect has a first portion coupled to a terminal of the die through the first layer, and a second portion that extends away from the first portion over the insulating material filling the space adjacent to the die. The ball interconnect is coupled to the second portion of the redistribution interconnect.

In an example fabrication process, a wafer is singulated into a plurality of integrated circuit dies that each includes an integrated circuit region. Each integrated circuit region includes a plurality of terminals. A non-active surface of each of the plurality of dies is attached to a first surface of the substrate such that the dies are spaced apart on the substrate in a predetermined arrangement. A substantially planar layer of an insulating material is formed on the first surface of the substrate to cover the dies on the substrate and to fill a space adjacent to each die on the substrate. At least one redistribution interconnect is formed on the insulating material for each die of the plurality of dies to have a first portion coupled to a terminal of a respective die and a second portion that extends away from the first portion over a portion of the space adjacent to the respective die. A ball interconnect is coupled to each second portion. The dies are singulated into a plurality of integrated circuit packages that each include a die of the plurality of dies and the portion of the space adjacent to the included die.

In further implementations, one or more vias, under bump metallization layers, additional insulating material layers, and/or other features may be formed in the integrated circuit packages to fabrication/configure the redistribution interconnects.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
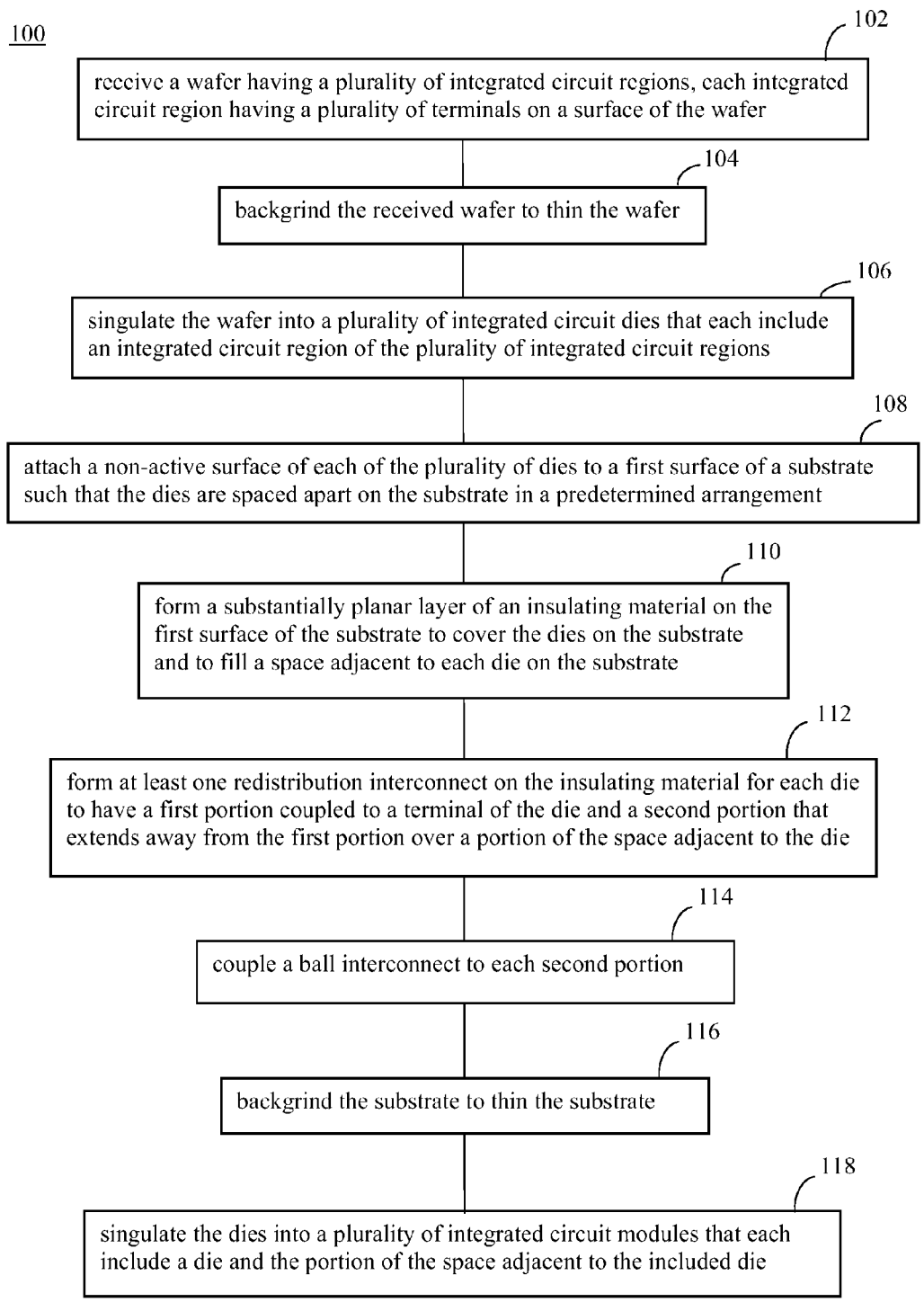
FIG. 1 shows a flowchart for forming integrated circuit packages, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Embodiments

"Wafer-level packaging" is an integrated circuit packaging technology where all packaging-related interconnects are applied while the integrated circuit dies or chips are still in wafer form. After the packaging-related interconnects are applied, the wafer is then tested and singulated into individual devices and sent directly to customers for their use. Thus, individual packaging of discreet devices is not required. The size of the final package is essentially the size of the corresponding chip, resulting in a very small package solution. Wafer-level packaging is becoming increasingly popular as the demand for increased functionality in small form-factor devices increases. These applications include mobile devices such as cell phones, PDAs, and MP3 players, for example.

The small size of wafer-level packages and the increasing integration of functionality into IC dies are making it increasingly difficult to attach enough pins (e.g., solder balls) to the wafer-level packages so that all desired signals of the dies can be externally interfaced. The pins of a device/package are limited to the surface area of the die. The pins on the die must be sufficiently spaced to allow end-users to surface mount the packages directly to circuit boards. If enough pins cannot be provided on the die, the end products will be unable to take advantage of the low cost and small size of the wafer-level packages. Such products will then need to use conventional IC packaging, which leads to much larger package sizes and is more costly.

Embodiments of the present invention enable wafer-level packages to have more pins than can conventionally be fit on a die surface. Embodiments use routing interconnects to enable pins to be located over a space adjacent to the die, effectively increasing an area of the die. Such embodiments are cost-effective, manufacturable, and enable small size packages to be fabricated having large numbers of pins. The example embodiments described herein are provided for illustrative purposes, and are not limiting. Although wafer-level ball grid array packages are mainly illustrated in the description below, the examples described herein may be adapted to a variety of types of wafer-level integrated circuit packages. Further structural and operational embodiments, including modifications/alterations, will become apparent to persons skilled in the relevant art(s) from the teachings herein.

FIG. 1 shows a flowchart 100 for forming integrated circuit packages, according to an embodiment of the present invention. The formed integrated circuit packages have pins (e.g., ball interconnects) spaced more widely than an area of the corresponding die alone, and thus enable larger numbers of pins to be accommodated. The steps of flowchart 100 do not necessarily need to be performed in the order shown. All steps of flowchart 100 do not need to be performed in all embodiments. Flowchart 100 is described below with reference to FIGS. 2-18, for illustrative purposes. Other structural and operational embodiments will be apparent to persons skilled in the relevant art(s) based on the discussion provided herein.

Figure 2:
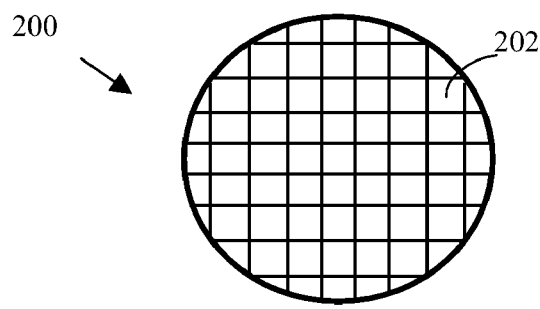
FIG. 2 shows a plan view of an example wafer.

Flowchart 100 begins with step 102. In step 102, a wafer is received having a plurality of integrated circuit regions, each integrated circuit region having a plurality of terminals on a surface of the wafer. For example, FIG. 2 shows a plan view of a wafer 200. Wafer 200 may be silicon, gallium arsenide, or other wafer type. As shown in FIG. 2, wafer 200 has a surface defined by a plurality of integrated circuit regions 202 (shown as small rectangles in FIG. 2). Each integrated circuit region 202 is configured to be packaged separately into a separate wafer-level integrated circuit package, such as a wafer-level ball grid array package. Any number of integrated circuit regions 202 may be included in wafer 200, including 10s, 100s, 1000s, and even larger numbers.

Figure 3:
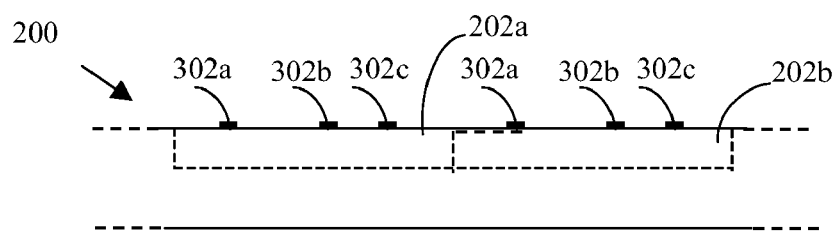
FIG. 3 shows a cross-sectional view of the wafer of FIG. 2, showing example first and second integrated circuit regions.

FIG. 3 shows a cross-sectional view of wafer 200, showing example first and second integrated circuit regions 202a and 202b. As shown in FIG. 3, integrated circuit regions 202a and 202b each include a plurality of terminals 302 (e.g., terminals 302a-302c). Terminals 302 are access points for electrical signals (e.g., input-output signals, power signals, ground signals, test signals, etc.) of integrated circuit regions 202. Any number of terminals 302 may be present on the surface of wafer 200 for each integrated circuit region 202, including 10s, 100s, and even larger numbers of terminals 302.

Figure 4:
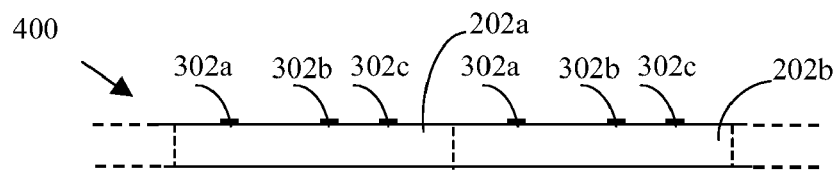
FIG. 4 shows a cross-sectional view of a wafer after having been thinned, according to an example embodiment of the present invention.

In step 104, the received wafer is thinned by backgrinding. Step 104 is optional. For instance, a backgrinding process may be performed on wafer 200 to reduce a thickness of wafer 200 to a desired amount, if desired and/or necessary. However, thinning of wafer 200 does not necessarily need to be performed in all embodiments. Wafer 200 may be thinned in any manner, as would be known to persons skilled in the relevant art(s). For instance, FIG. 4 shows a cross-sectional view of wafer 200 after having been thinned according to step 104, resulting in a thinned wafer 400. According to step 104, wafer 200 is made as thin as possible to aid in minimizing a thickness of resulting packages that will include integrated circuit regions 202.

Figure 5:
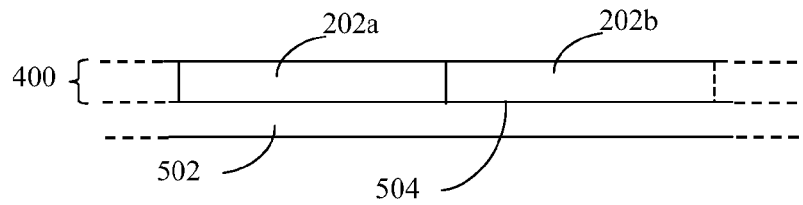
FIG. 5 shows a cross-sectional view of an adhesive material applied to a thinned wafer, according to an example embodiment of the present invention.

In an embodiment, flowchart 100 may optionally include the step of applying an adhesive material to a non-active surface of the wafer. For example, FIG. 5 shows a cross-sectional view of thinned wafer 400, with an adhesive material 502 applied to a non-active surface 504 of thinned wafer 400. Any suitable type of adhesive material may be used for adhesive material 502, including an epoxy, a conventional die-attach material, adhesive film, etc. This step is not necessarily performed in all embodiments, as further described below.

Figure 6:
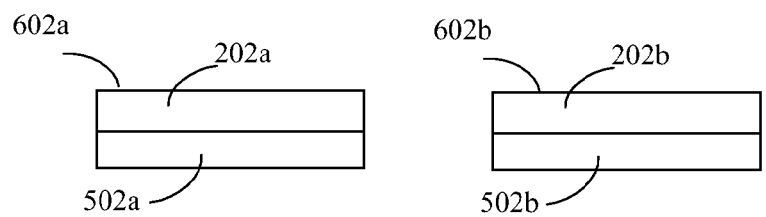
FIG. 6 shows a cross-sectional view of integrated circuit regions having been singulated into separate dies, according to an example embodiment of the present invention.

In step 106, the wafer is singulated into a plurality of integrated circuit dies that each include an integrated circuit region of the plurality of integrated circuit regions. Wafer 200 may be singulated/diced in any appropriate manner to physically separate the integrated circuit regions from each other, as would be known to persons skilled in the relevant art(s). For example wafer 200 may be singulated by a saw, router, laser, etc., in a conventional or other fashion. FIG. 6 shows a cross-sectional view of integrated circuit regions 202a and 202b having been singulated from each other (also including adhesive material 502a and 502b, respectively) into dies 602a and 602b, respectively. Singulation of wafer 200 may result in 10s, 100s, 1000s, or even larger numbers of dies 602, depending on a number of integrated circuit regions 202 of wafer 200.

Figure 7:
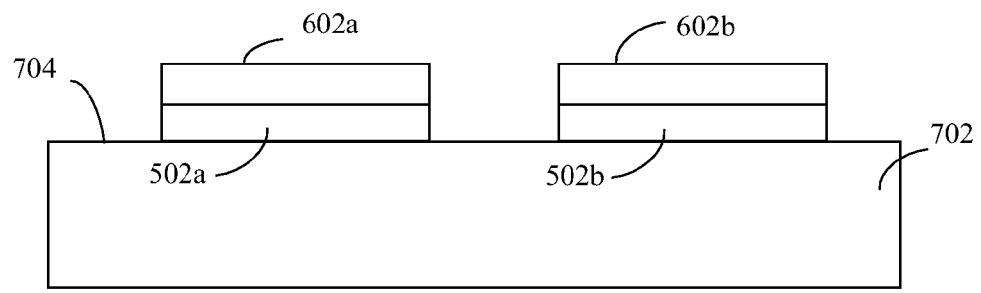
FIG. 7 shows a cross-sectional view of dies attached to a substrate, according to an example embodiment of the present invention.

In step 108, a non-active surface of each of the plurality of dies is attached to a first surface of a substrate such that the dies are spaced apart on the substrate in a predetermined arrangement. For example, FIG. 7 shows a cross-sectional view of dies 602a and 602b attached to a first surface 704 of a substrate 702. As shown in FIG. 7, the non-active surface (i.e., surface 504 shown in FIG. 5) of each of dies 602a and 602b is attached to first surface 704 of substrate 702 by adhesive material 502a and 502b. For example, dies 602a and 602b may be positioned on substrate 702 in any manner, including through the use of a pick-and-place apparatus. After positioning of dies 602a and 602b, adhesive material 502a and 502b may be cured to cause dies 602a and 602b to become attached to substrate 702. Note that in embodiments, adhesive material 502 may be applied to first surface 704 of substrate 702 alternatively to, or in addition to applying adhesive material 502 on wafer 200/dies 602, as described above.

Substrate 702 can be any type of substrate material, including a dielectric material, a ceramic, a polymer, a semiconductor material, etc. For example, in an embodiment, substrate 702 is a wafer of a same material as wafer 200. For instance, wafer 200 and substrate 702 may both be silicon wafers. By having wafer 200 (and thus dies 602) and substrate 702 be the same material, dies 602 and substrate 702 will react similarly during subsequent processing and operation, and thus will be more likely to adhere to each other more securely. For example, during temperature changes, dies 602 and substrate 702 will react similarly, such as by expanding or contracting uniformly, and thus will be less likely to detach from each other and less likely deviate from their placed positions to cause registration issues with subsequent lithography steps.

Figure 8:
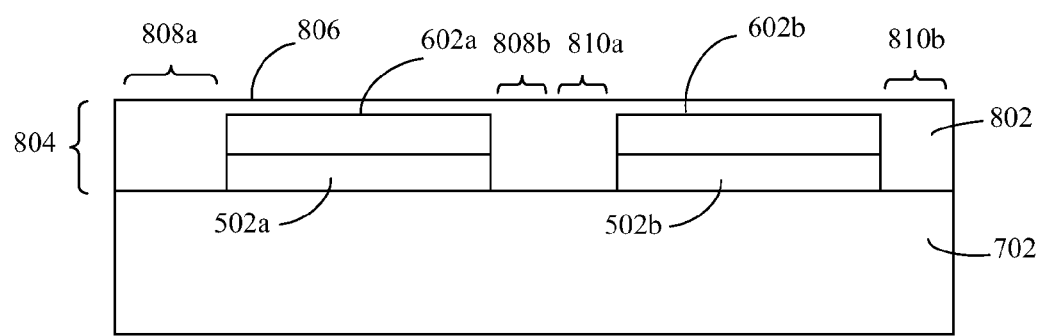
FIG. 8 shows a cross-sectional view of a layer of an insulating material applied to a substrate to cover attached dies, according to an example embodiment of the present invention.

In step 110, a substantially planar layer of an insulating material is formed on the first surface of the substrate to cover the dies on the substrate and to fill a space adjacent to each die on the substrate. For instance, FIG. 8 shows a cross-sectional view of a layer 804 of an insulating material 802 applied to substrate 702 to cover dies 602a and 602b. Insulating material 802 may be applied in any manner, conventional or otherwise, as would be known to persons skilled in the relevant art(s). For example, insulating material 802 may be applied according to a spin on or dry film process, and subsequently cured/dried, similar to a corresponding wafer-level process. Insulating material 802 is applied such that layer 804 has a thickness greater than a thickness of dies 602 (and adhesive material 502). Layer 804 may be formed or processed (e.g., polished) such that a first surface 806 of layer 804 is substantially planar. Insulating material 802 may be an electrically insulating material, such as a polymer, a dielectric material such as a photo-imagable dielectric, and/or other electrically non-conductive material.

As shown in FIG. 8, insulating material 802 covers dies 602a and 602b. Furthermore, as shown in FIG. 8, insulating material 802 fills spaces 808a and 808b adjacent to die 602a on substrate 702, and fills spaces 810a and 810b adjacent to die 602b on substrate 702. Insulating material 802 may fill spaces on any number of sides (edges of dies 602 perpendicular to their active surfaces) of dies 602, including all four sides, in embodiments.

Figure 11:
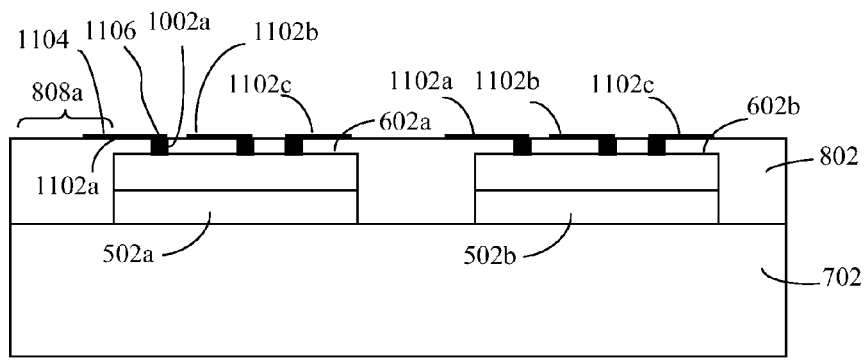
FIG. 11 shows routing interconnects formed on the insulating material of FIG. 10, according to an example embodiment of the present invention.

In step 112, at least one redistribution interconnect is formed on the insulating material for each die to have a first portion coupled to a terminal of the die and a second portion that extends away from the first portion over a portion of the space adjacent to the die. For example, FIG. 11 shows redistribution interconnects 1102a-1102c, also known as "redistribution layers (RDLs)," formed on insulating material 802 for each of dies 602a and 602b. With reference to redistribution interconnect 1102a, for example, redistribution interconnect 1102a has a first portion 1104 and a second portion 1106.

First portion 1104 is coupled to a terminal of die 602a. Second portion 1106 extends away from first portion 1104 (e.g., laterally) over insulating material 802, over a portion of space 808a adjacent to die 602a. Note that not all redistribution interconnects 1102 necessarily extend over a space adjacent to a die 602. For example, redistribution interconnects 1102b and 1102c coupled to terminals of die 602a do not extend over a space adjacent to die 602a.

Figure 9:
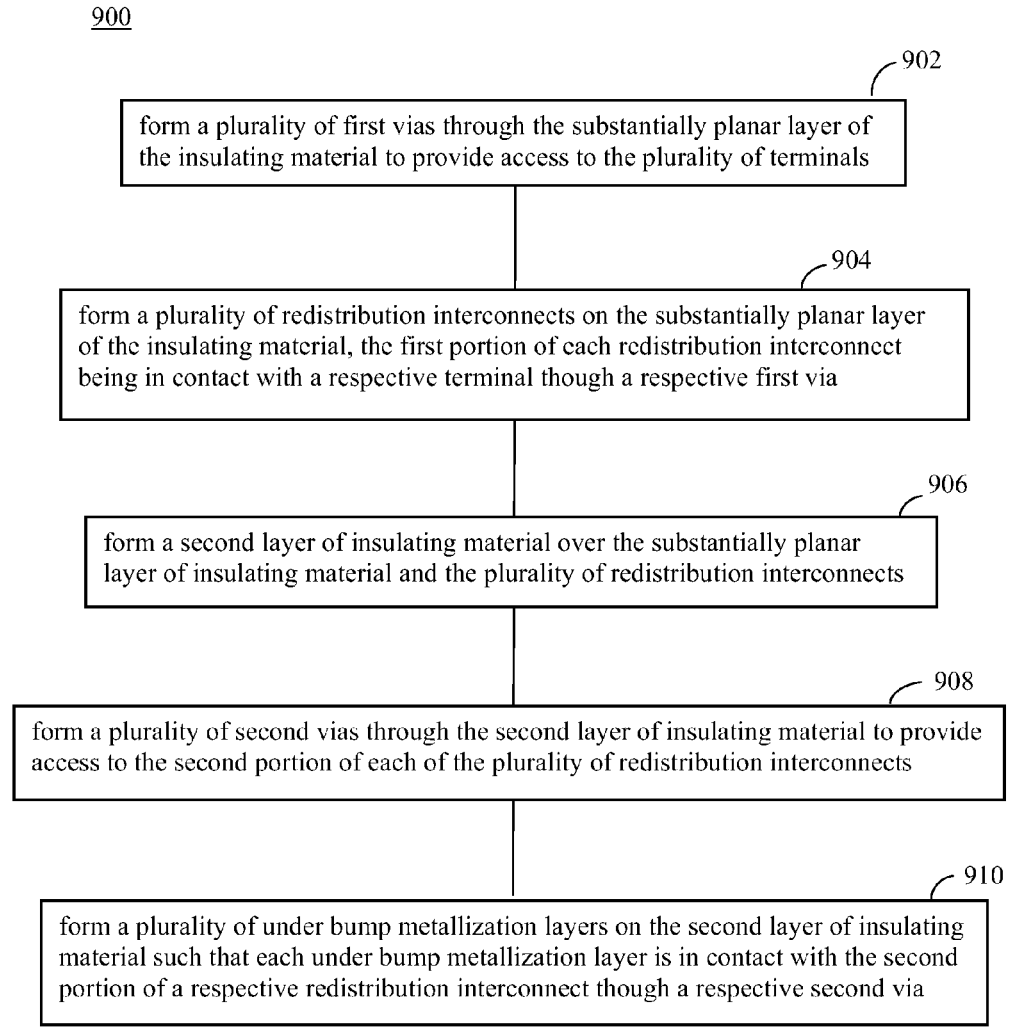
FIG. 9 shows a flowchart providing example steps for forming redistribution interconnects, according to an embodiment of the present invention.

Redistribution interconnects 1102 may be formed in step 112 in any manner, including being formed according to processes used in standard wafer-level packaging fabrication processes. For instance, FIG. 9 shows a flowchart 900 providing example steps for forming redistribution interconnects 1102, according to an embodiment of the present invention. Not all steps of flowchart 900 need to be performed in all embodiments, and that redistribution interconnects 1102 may be formed according to processes other than flowchart 900. Flowchart 900 is described below with respect to FIGS. 10-14, for illustrative purposes.

Figure 10:
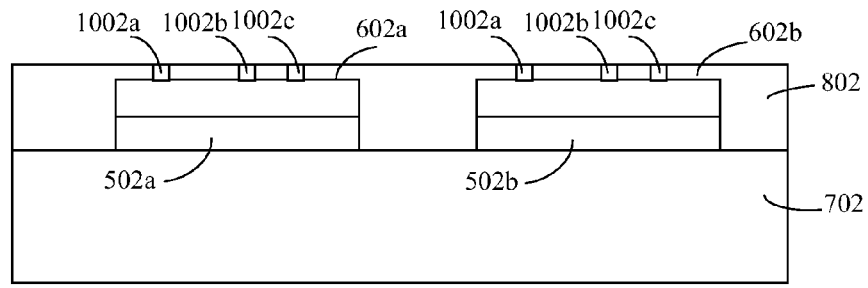
FIG. 10 shows a cross-sectional view of a substrate and attached dies covered with an insulating material, according to an embodiment of the present invention.

Flowchart 900 begins with step 902. In step 902, a plurality of first vias is formed through the substantially planar layer of the insulating material to provide access to the plurality of terminals. For example, FIG. 10 shows a cross-sectional view of substrate 702, with dies 602a and 602b covered on substrate 702 with insulating material 802. As further shown in FIG. 10, a plurality of vias 1002a-1002c are formed through insulating material 802 for both of dies 602a and 602b. Each via 1002 provides access to a respective terminal (e.g., one of terminals 302 shown in FIG. 3). Any number of vias 1002 may be present, depending on a number of terminals present. Note that vias 1002 may have straight vertical walls (e.g., vias 1002 may have a cylindrical shape) as shown in FIG. 10, may have sloped walls, or may have other shapes. Vias 1002 may be formed in any manner, including by etching, drilling, etc., as would be known to persons skilled in the relevant art(s).

In step 904, a plurality of redistribution interconnects is formed on the substantially planar layer of the insulating material, the first portion of each redistribution interconnect being in contact with a respective terminal though a respective first via. For example, as shown in FIG. 11, and as described above, routing interconnects 1102a-1102c are formed on insulating material 802 for each of dies 602a and 602b. As described above, routing interconnect 1102a has a first portion 1106 and a second portion 1104. First portion 1106 of routing interconnect 1102a is in contact with a terminal of die 602a through via 1002a (formed in step 902), and second portion 1106 of routing interconnect 1102a extends (e.g., laterally) over insulating material 802. In this manner, a plurality of redistribution layers 1102 are formed for dies 602a and 602b, where at least some of which extend over the space adjacent to dies 602.

Note that second portions 1102 of routing interconnects 1102 can have various shapes. For example, second portions 1102 may be rectangular shaped, may have a rounded shape, or may have other shapes. In an embodiment, first portion 1106 of routing interconnects 1102 may be similar to a standard via plating, and second portion 1104 may extend from first portion 1106 in a similar fashion as a standard metal trace formed on a substrate. Routing interconnects 1102 may be formed of any suitable electrically conductive material, including a metal such as a solder or solder alloy, copper, aluminum, gold, silver, nickel, tin, titanium, a combination of metals/alloy, etc. Routing interconnects 1102 may be formed in any manner, including sputtering, plating, lithographic processes, etc., as would be known to persons skilled in the relevant art(s).

Figure 12:
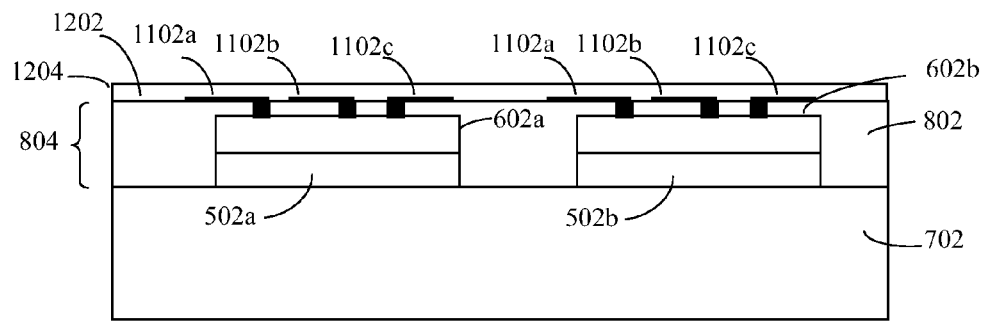
FIG. 12 shows a cross-sectional view of a second layer of an insulating material formed over the first layer of insulating material and redistribution interconnects, according to an example embodiment of the present invention.

In step 906, a second layer of insulating material is formed over the substantially planar layer of insulating material and the plurality of redistribution interconnects. For instance, FIG. 12 shows a cross-sectional view of a second layer 1204 of an insulating material 1202 formed over first layer 804 of insulating material 802 and redistribution interconnects 1102. Second insulating material 1202 may be applied in any manner, conventional or otherwise, as would be known to persons skilled in the relevant art(s). For example, insulating material 1202 may be applied according to a spin on or dry film process, similar to a corresponding wafer-level process. Insulating material 1202 is applied such that layer 1204 electrically insulates a top surface of redistribution interconnects 1102. Layer 1204 may be formed or processed (e.g., polished) to be substantially planar. Insulating material 1202 may be the same material or a different material from insulating material 802. For example, insulating material 1202 may be an electrically insulating material, such as a polymer, a dielectric material such as a photo-imagable dielectric, and/or other electrically non-conductive material.

Figure 13:
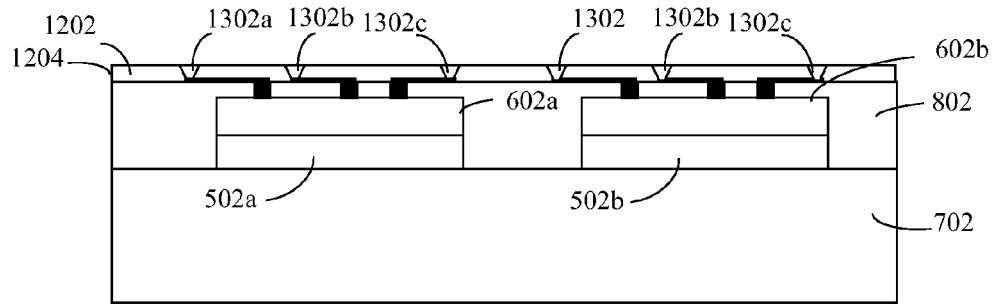
FIG. 13 shows a cross-sectional view of a plurality of vias formed through the second layer of insulating material to provide access to redistribution interconnects, according to an example embodiment of the present invention.

In step 908, a plurality of second vias is formed through the second layer of insulating material to provide access to the second portion of each of the plurality of redistribution interconnects. For example, FIG. 13 shows a cross-sectional view of second vias 1302a-1302c formed through second insulating material 1202 for each of dies 602a and 602b to provide access to second portions 1104 of redistribution interconnects 1102a-1102c, respectively. Each second via 1302 provides access to a respective redistribution interconnect 1102. Any number of second vias 1302 may be present, depending on a number of redistribution interconnects present. Note that second vias 1302 may have sloped walls as shown in FIG. 13, may have straight vertical walls (e.g., vias 1302 may have a cylindrical shape), or may have other shapes. Second vias 1302 may be formed in any manner, including by etching, drilling, etc., as would be known to persons skilled in the relevant art(s).

Figure 14:
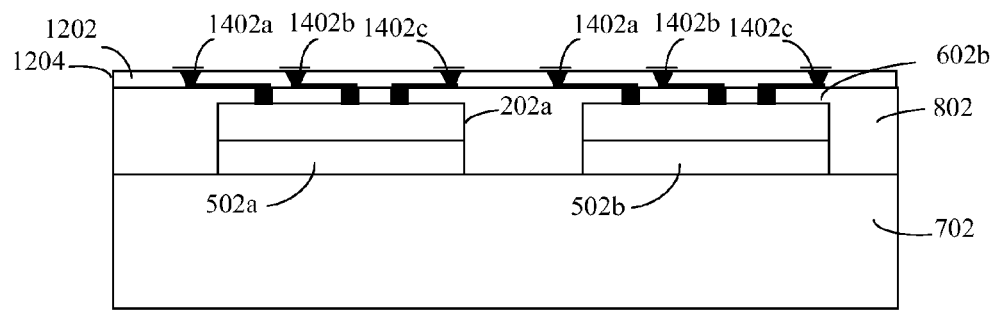
FIG. 14 shows a cross-sectional view of under bump metallization layers formed in contact with respective redistribution interconnects through vias, according to an example embodiment of the present invention.

In step 910, a plurality of under bump metallization layers is formed on the second layer of insulating material such that each under bump metallization layer is in contact with the second portion of a respective redistribution interconnect though a respective second via. For example, FIG. 14 shows a cross-sectional view of under bump metallization layers 1402a-1402c formed in contact with second portions 1104 of respective redistribution interconnects 1102 through respective second vias 1302. Under bump metallization (UBM) layers 1402 are typically one or more metal layers formed (e.g., by metal deposition—plating, sputtering, etc.) to provide a robust interface between redistribution interconnects 1102 and a package interconnect mechanism (such as a ball interconnect). A UBM layer serves as a solderable layer for a solder package interconnect mechanism. Furthermore, a UBM provides protection for underlying metal or circuitry from chemical/thermal/electrical interactions between the various metals/alloys used for the package interconnect mechanism. In an embodiment, UBM layers 1402 are formed similarly to standard via plating.

Figure 15:
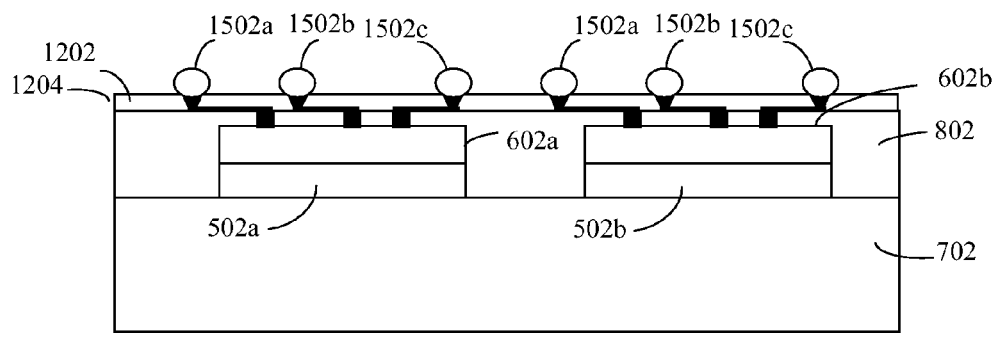
FIG. 15 shows a cross-sectional view of ball interconnects formed on under bump metallization layers, according to an example embodiment of the present invention.
Figure 16:
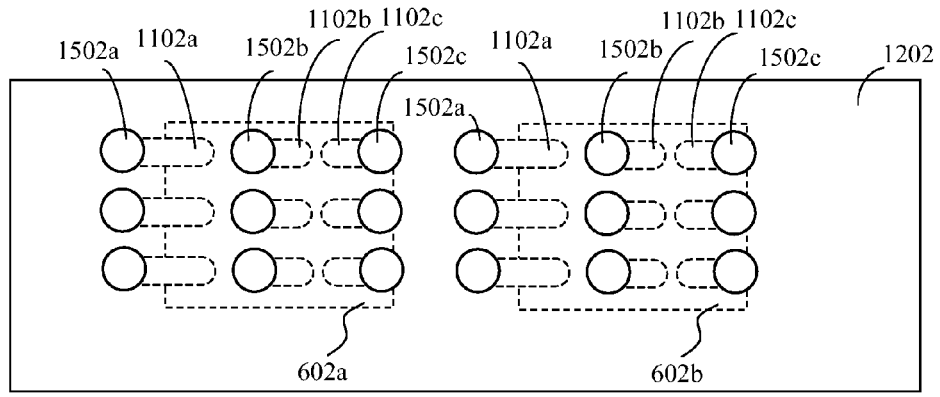
FIG. 16 shows a plan view of ball interconnects for multiple dies that are spaced according to an example embodiment of the present invention.

Referring back to flowchart 100, in step 114, a ball interconnect is coupled to each second portion. For example, FIG. 15 shows a cross-sectional view of ball interconnects 1502a-1502c formed on respective UBM layers 1402a-1402c for each of dies 602a and 602b. In this manner, a plurality of ball interconnects 1502 may be formed in electrical contact with respective routing interconnects 1102. For instance, FIG. 16 shows a plan view of a surface of insulating material 1202, where ball interconnects 1502 related to dies 602a and 602b (indicated by dotted lines) are visible, according to an example embodiment of the present invention. As shown in FIG. 16, each ball interconnect 1502 is coupled to a respective redistribution interconnect 1102 (shown as dotted lines). Furthermore, some ball interconnects 1502 are coupled to redistribution interconnects 1102, such as ball interconnect 1502a coupled to redistribution interconnect 1102a, in a manner such that the ball interconnect 1502 is over insulating material 1202 outside of a periphery of the respective die 602, instead of in an area within the die periphery. In this manner, an effective area of dies 602 is increased for attachment of ball interconnects 1502.

In FIG. 16, ball interconnects 1502a-1502c are formed as part of a 3 by 3 array of ball interconnects 1502 for each of dies 602a and 602b. Arrays of ball interconnects 1502 of any size may be present relating to a particular die 602, depending on a number of redistribution interconnects 1102 that are present. Ball interconnects 1502 may be formed of any suitable electrically conductive material, including a metal such as a solder or solder alloy, copper, aluminum, gold, silver, nickel, tin, titanium, a combination of metals/alloy, etc. Ball interconnects 1502 may have any size and pitch, as desired for a particular application. Ball interconnects 1502 may be any type of ball interconnect, including a solder ball, a solder bump, etc. Ball interconnects 1502 may be formed in any manner, including sputtering, plating, lithographic processes, etc., as would be known to persons skilled in the relevant art(s). Ball interconnects 1502 are used to interface resulting wafer-level packages with an external device, such as a PCB.

Figure 17:
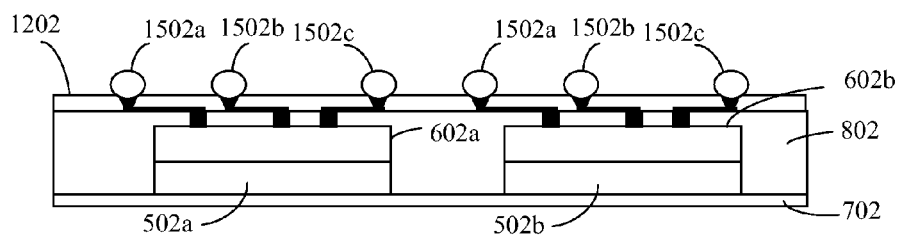
FIG. 17 shows a cross-sectional view of a substrate after having been thinned, according to an example embodiment of the present invention.

In step 116, the substrate is thinned by backgrinding the substrate. Step 116 is optional. A backgrinding process may be performed on substrate 702 to reduce a thickness of substrate 702 to a desired amount, if desired and/or necessary. Substrate 702 may be thinned in any manner, as would be known to persons skilled in the relevant art(s). FIG. 17 shows a cross-sectional view of substrate 702 after having been thinned according to step 116. According to step 116, substrate 702 is made as thin as possible to aid in minimizing a thickness of resulting packages that are formed according to flowchart 100. For example, in an embodiment, a thinning process may be performed that completely removes substrate 702 from dies 602, and may optionally also remove some or all of adhesive material 502, from dies 602.

In step 118, the dies are singulated into a plurality of integrated circuit packages that each include a die and the portion of the space adjacent to the included die. Dies 602 may be singulated/diced in any appropriate manner to physically separate the dies from each other, as would be known to persons skilled in the relevant art(s). Singulation according to step 118 may result in 10s, 100s, 1000s, or even larger numbers of integrated circuit module 1802, depending on a number of dies 602 that are present.

Figure 18:
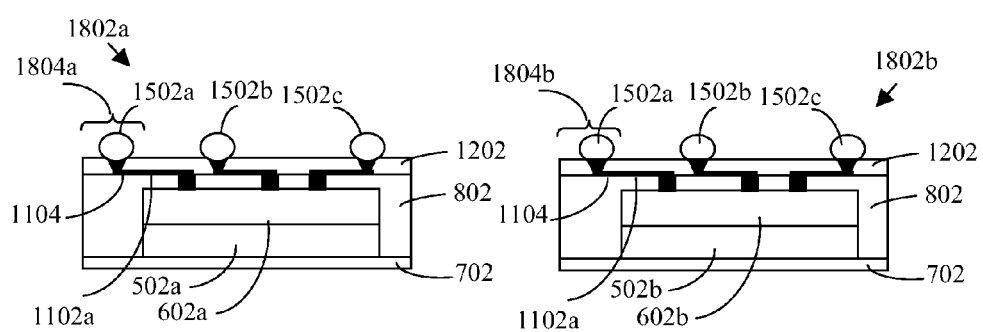
FIG. 18 shows a cross-sectional view of integrated circuit packages having been singulated from each other, according to an example embodiment of the present invention.

For example, in FIG. 17, dies 602 may be singulated by cutting through first and second insulating material layers 802 and 1202 and substrate 702 (when present), to separate dies 602 from each other, with each die 602 including a portion of its adjacent space. Dies 602 may be singulated by a saw, router, laser, etc., in a conventional or other fashion. FIG. 18 shows a cross-sectional view of integrated circuit packages 1802a and 1802b, having been singulated from each other. Integrated circuit packages 1802a and 1802b respectively include dies 602a and 602b, and respective portions 1804a and 1804b of adjacent space (e.g., portions of space 808a and 810a, respectively) filled with insulating material 802. Second portions 1104 of redistribution interconnects 1102a extend over portions 1804a and 1804b of the adjacent space included with singulated dies 602a and 602b, respectively.

Figure 19:
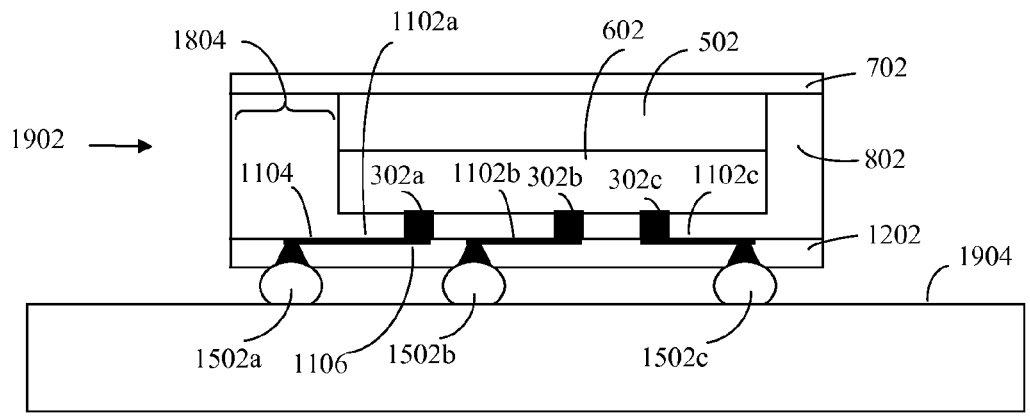
FIG. 19 shows an integrated circuit package mounted to a circuit board, according to an example embodiment of the present invention.

FIG. 19 shows an integrated circuit package 1902 mounted to a circuit board 1904. Integrated circuit package 1902 of FIG. 19 is an example wafer-level package, formed according to an embodiment of the present invention. Package 1902 may be formed in the manner that packages 1802a and 1802b of FIG. 18 are formed (e.g., according to flowchart 100 shown in FIG. 1). Alternatively, package 1902 may be formed by other fabrication process, including by forming package 1902 in parallel with the forming of other packages (similarly to flowchart 100) or by forming package 1902 individually. As shown in FIG. 19, package 1902 includes die 602, which has a plurality of terminals 302a-302c on a first surface, insulating material 802, redistribution interconnects 1102a-1102c, and ball interconnects 1502a-1502c. Insulating material 802 covers the active surface of die 602, and fills space 1804 adjacent one or more sides of die 602. Redistribution interconnect 1102a on insulating material 802 has first portion 1106 coupled to terminal 302a of die 602 through insulating material 802, and has second portion 1104 that extends away from first portion 1106 over insulating material 802. Ball interconnect 1502a is coupled to second portion 1104 of redistribution interconnect 1102a over space 1804. Thus, redistribution interconnect 1102 effective expands an area of die 602 for attachment of ball interconnects.

Note that in an embodiment, the thinned portion of substrate 702 shown in FIG. 19 may be present in package 1902. Alternatively, substrate 702 may not be present in package 1902. Furthermore, in embodiments, one or more vias (e.g., first vias 1002 of FIG. 10, second vias 1302 of FIG. 13), under bump metallization layers (e.g., under bump metallization layers 1402), additional insulating material layers (e.g., second layer 1204 of insulating material 1202), and/or other additional features may be present in package 1902 to fabricate/configure redistribution interconnects 1102, as needed.

Figure 20:
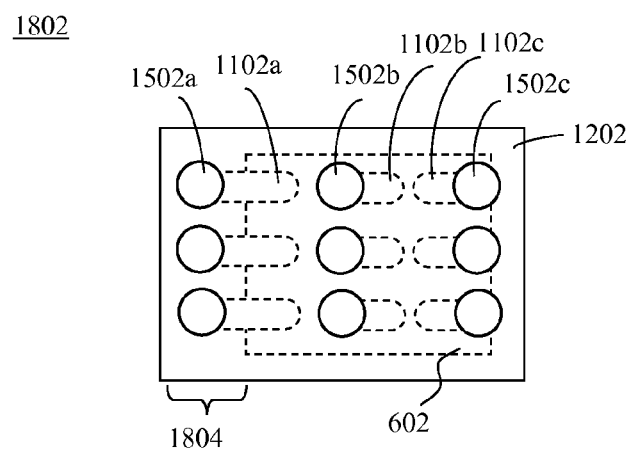
FIG. 20 show a bottom view of a package having a plurality of ball interconnects spaced according to an example embodiment of the present invention.

FIG. 20 show a bottom view of package 1802, where ball interconnects 1502a-1502c form a portion of a 3 by 3 array of ball interconnects 1502. Ball interconnects 1502 are used to couple attach package 1802 to circuit board 1904 in FIG. 19. As shown in FIG. 20, three ball interconnects 1502, including ball interconnect 1502a, are coupled through redistribution interconnects 1102, such as redistribution interconnect 1102a, to terminals of die 602. Furthermore, the three ball interconnects 1502 are over space 1804 adjacent to die 602. Thus, the area of die 602 is effectively increased by an area of space 1804 for attachment of three additional ball interconnects 1502. Embodiments of the present invention enable the attachment of any number of ball interconnects 1502, depending on the particular implementation, as would be known to persons skilled in the relevant art(s) from the teachings herein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) package, comprising:
   an integrated circuit die having a plurality of terminals on a first surface of the integrated circuit die;
   a first layer of an insulating material that covers the first surface of the die and fills a space adjacent to at least one side of the die;
   a plurality of first vias through the first layer of the insulating material to provide access to the plurality of terminals;
   a redistribution interconnect on the first layer of the insulating material that has a first portion coupled to a terminal of the die through a first via through the first layer and a second portion that extends away from the first portion over the insulating material filling the space adjacent to the die;

a second layer of insulating material over the first layer of insulating material and the redistribution interconnect;

a second via through the second layer of insulating material to provide access to the second portion of the redistribution interconnect;

an under bump metallization (UBM) layer on the second layer of insulating material in contact with the second portion of the redistribution interconnect though the second via;

a ball interconnect formed on the UBM layer over the second via;

a substrate material having opposing first and second surfaces and that forms a surface of the integrated circuit package; and an adhesive material that attaches a second surface of the die to the first surface of the substrate material, the adhesive material being positioned between the first surface of the substrate material and the second surface of the integrated circuit die and not covering the first surface of the substrate material outside of a periphery of the second surface of the integrated circuit die.

2. The package of claim 1, wherein the substrate material comprises a same material as the die.

3. The package of claim 1, wherein the substrate material is a thinned wafer.

4. The package of claim 1, further comprising:

a second redistribution interconnect on the first layer of the insulating material that has a first portion coupled to a second terminal of the die through the first layer and a second portion that extends away from the first portion and terminates over the die without extending over the insulating material filling the space adjacent to the die.

5. The package of claim 1, wherein the insulating material is a photo-imagable dielectric.

6. The package of claim 1, wherein the adhesive material is an adhesive film.

7. The package of claim 1, wherein the UBM layer consists of a single metal layer.

8. The package of claim 1, wherein the UBM layer includes a plurality of metal layers.

9. The package of claim 1, wherein the UBM layer is configured to interface the ball interconnect and the redistribution interconnect to provide protection from chemical, thermal, and electrical interactions between the ball interconnect and the redistribution interconnect.

10. The package of claim 1, further comprising:

a plurality of redistribution interconnects on the first layer of the insulating material that each have a first portion coupled to a corresponding terminal of the die through a corresponding first via through the first layer and a second portion that extends away from the first portion.

11. The package of claim 10, further comprising:

a plurality of second vias through the second layer of insulating material that each provide access to a corresponding second portion of the plurality of redistribution interconnects;

a plurality of UBM layers on the second layer of insulating material that are each in contact with a corresponding second portion of the plurality of redistribution interconnects though a corresponding second via of the plurality of second vias; and a plurality of ball interconnects that are each formed on a corresponding UBM layer of the plurality of UBM layers over the corresponding second via.

* * * * *

UNITED STATES PATENT AND TRADEMARK OFFICE
CERTIFICATE OF CORRECTION

PATENT NO. : 7,872,347 B2
APPLICATION NO. : 11/836606
DATED : January 18, 2011
INVENTOR(S) : Kaufmann It is certified that error appears in the above-identified patent and that said Letters Patent is hereby corrected as shown below:

In column 11, line 8-9, in claim 1, delete "interconnect though the second via" and insert -- interconnect through the second via --, therefor.

In column 12, line 27-28, in claim 11, delete "interconnects though a corresponding second via" and insert -- interconnects through a corresponding second via --, therefor.

Signed and Sealed this
Thirty-first Day of May, 2011

David J. Kappos
*Director of the United States Patent and Trademark Office*